US00RE40788E

(19) United States
(12) Reissued Patent
Von Asten et al.

(10) Patent Number: US RE40,788 E
(45) Date of Reissued Patent: Jun. 23, 2009

(54) LITHO STRIP AND METHOD FOR ITS MANUFACTURE

(75) Inventors: Wolfgang Von Asten, Pulheim (DE); Bernhard Kernig, Köln (DE); Barbara Grzemba, Bonn (DE)

(73) Assignee: Hydro Aluminium Deutschland GmbH, Cologne (DE)

(21) Appl. No.: 10/938,496

(22) Filed: Sep. 10, 2004

Related U.S. Patent Documents

Reissue of:
(64) Patent No.: 6,447,982
Issued: Sep. 10, 2002
Appl. No.: 09/608,722
Filed: Jun. 30, 2000

(30) Foreign Application Priority Data

Jul. 2, 1999 (DE) ..... 199 30 720
Nov. 25, 1999 (DE) ..... 199 56 692

(51) Int. Cl.
*G03F 7/09* (2006.01)
*B41B 3/00* (2006.01)
*B41N 3/03* (2006.01)
*C22F 1/04* (2006.01)
*C22C 21/00* (2006.01)

(52) U.S. Cl. ..... 430/278.1; 430/526; 430/459; 101/459; 205/201; 205/214; 420/547; 420/544; 420/543; 428/469; 148/440

(58) Field of Classification Search ..... 430/278.1, 430/526, 429; 101/459; 205/201, 214; 204/129.4; 428/469; 420/547, 544, 543; 148/440
See application file for complete search history.

(56) References Cited

U.S. PATENT DOCUMENTS

| | | | | | |
|---|---|---|---|---|---|
| 3,911,819 | A | * | 10/1975 | Pryor et al. | 428/652 |
| 4,435,230 | A | * | 3/1984 | Fujikura | 148/537 |
| 4,715,903 | A | | 12/1987 | Asten et al. | |
| 4,729,939 | A | * | 3/1988 | Nishikawa et al. | 430/278.1 |
| 4,822,715 | A | * | 4/1989 | Shoji et al. | 430/155 |
| 4,836,863 | A | | 6/1989 | Matsuo et al. | |
| 4,945,004 | A | * | 7/1990 | Sprintschnik et al. | 428/469 |
| 5,110,371 | A | | 5/1992 | Moriyama et al. | |
| 5,114,825 | A | * | 5/1992 | Takizawa et al. | 430/159 |

FOREIGN PATENT DOCUMENTS

| | | | | |
|---|---|---|---|---|
| DE | 3232810 | A1 | * | 3/1983 |
| EP | 0 097 318 | A2 | | 1/1984 |
| EP | 0774692 | | * | 5/1997 |
| FR | 2 179 515 | | | 11/1973 |
| JP | 60-5861 | | * | 1/1985 |
| JP | 61146598 | | * | 7/1986 |
| JP | 62086143 | | * | 4/1987 |
| JP | 01247547 | A | | 10/1989 |
| JP | 11-61364 | | * | 3/1999 |

OTHER PUBLICATIONS

P. Laevers et al, "The influence of Manganese on the AC Electrolytic Graining of Auminium," Corrosion Science, vol. 38, No. 3, pp. 413–429 (Mar. 1996).*
English Translation of JP Kokai No. 60–5861 (from original application).*
English Translation of JP Kokai No. 11–61364 (from original application).*
AN 1974:431131, File Caplus, dated entered STN May 12, 1984, English abstract of FR 2179515 and Reg Number alloy related thereto from ACS on STN, 3 pages.*
"Aluminum vol. I Properties, Physical Metallurgy and Phase Diagrams, " ed. Van Horn, Kent R., Kent R., American Society for Metals, Metals Park, Ohio, pp. 92–94 (1967).
Monodolfo, L. F., "Aluminum Alloys: Structure and Properties, Chapter 5: Electrical, Magnetic Properties," Boston, Butterworth & Co., pp. 96–99 (1976).

* cited by examiner

*Primary Examiner*—Cynthia Hamilton
(74) *Attorney, Agent, or Firm*—Proskauer Rose LLP

(57) ABSTRACT

A litho strip for use as an offset printing plate is described which has a composition of 0.05–0.25% Si, 0.30–0.40% Fe, 0.10–0.30% Mg, max. 0.05% Mn, and max. 0.04% Cu. The strip is produced from a continuous cast ingot of the above composition which is hot rolled to a thickness of up to 2–7 mm. The residual resistance ratio of the hot rolled strip is RR=10–20. The cold rolling is carried out with or without intermediate annealing, wherein the degree of rolling reduction after intermediate annealing is >60%. The further processing up to the EC roughening takes place with the microstructure adjusted in the rolling process at <100° C. The litho strip is characterized by a high thermal stability, a good roughening behavior in the EC processes, and a high reverse bending fatigue strength perpendicular to the rolling direction.

8 Claims, 1 Drawing Sheet

LITHO STRIP AND METHOD FOR ITS MANUFACTURE

Matter enclosed in heavy brackets [ ] appears in the original patent but forms no part of this reissue specification; matter printed in italics indicates the additions made by reissue.

This claims the benefit of copening German Applications Nos. 19930720.2, filed Jul. 2, 1999 and 19956692.5, filed Nov. 25, 1992.

The invention relates to a litho strip, comprised of a rolled aluminum alloy, for electrochemical roughening and a method for its manufacture Very high requirements are placed on the purity and uniformness of litho strip surfaces and, therefore, special measures must be taken already during casting of the blank material so that no oxides or other contaminants can contaminate the metal. Rectangular cast ingots provide the blank material which, after milling off the casting skin, are rolled by means of hot or cold reduction to thin strip. The finish-rolling is performed usually with fine-ground steel rolls so that, as a standard, a so-called mill-finish surface is obtained. The semi-finished product is referred to as offset strip or litho strip and is conventionally rolled to a coil.

As a standard material high-grade aluminum (AA1050) as well as alloys of the type AlMn1 (AA3003, AA3103) are used.

The rolled strip is then further processed to printing plate supports by roughening the strip surface. Mechanical, chemical, and electrochemical roughening processes as well as combinations thereof are known. It is standard practice to perform the electrochemical (EC) roughening in baths based on HCl or $HNO_3$; the topography produced thereby is characterized by fine, round pits of a diameter of <20 μm; the printing plate is rough across the entire surface and exhibits a structure-less appearance (no streakiness effects). The roughened structure is protected by anodization, i.e., by a thin hard oxide layer. By applying a photosensitive photo layer, the printing plate support is transformed into an offset printing plate. The printing plates are irradiated and developed. In the case of positive plates the photosensitive layer is burned in at temperatures in the range of 220–300° C. and burning times of 3–10 mm.; by this thermal treatment the image points become abrasion-proof so that the printing plate is suitable for high printing editions. In this context, the Al printing plate support should lose as little as possible of its strength because soft plates can no longer be handled without buckling.

The finished printing plate is inserted into the printing machine. Important is an exact clamping of the plate on the printing cylinder so that no movement play will result during the printing process. When the printing plate is not perfectly secured and is thus cyclically subjected to bending or torsional loads during printing, plate cracking occurs according to practical experience in the fast running rotary offset printing machines. The reason for this is fatigue fracture, and the result is an immediate interruption of the printing process. Al-materials for offset printing plates therefore must exhibit a sufficiently high fatigue strength or reversed bending fatigue strength so that plate cracking can be prevented.

It is known that the employed material type has an effect on the reversed bending fatigue strength; as is known from practical experience, offset printing plates made of AlMn alloys (AA3003, AA3103) have a reduced tendency to exhibit plate cracking in comparison to offset printing plates made of high-grade aluminum (AA1050). A disadvantage of the AlMn alloys is an insufficient roughening behaviour in the EC processes. Consequently, the material AA 1050 is preferably employed for EC-roughened plates.

The printing plate manufacturers also know that there is a great difference with respect to the sensitivity toward plate cracking depending on the direction in which the printing plate is taken from a rolled Al strip: when taking the plate parallel to the rolling direction and clamping it such that the previous rolling direction is oriented in the running direction of the printing machine, the plates will crack substantially less frequently, as is known from practical experience, than when taking the plates perpendicularly to the rolling direction ("transverse direction"). For preventing plate cracking, printing plates for rotary offset printing machines are therefore preferably taken in the parallel rolling direction (in "longitudinal direction") from the rolled Al strip. This measure presents a strong limitation with respect to economical considerations for cutting the coils into different printing plate formats.

For increasing the productivity, printing machines have been developed in recent years which require offset printing plates that are oversized with respect to their width and have a width of >1700 mm. The plates for this new printing machine generation must be taken from the aluminum coil in a direction transverse to the rolling direction because at the moment neither the semi-finished product manufacturers nor the printing plate manufacturers can produce widths of >1,700 mm. For the new printing machines, which require oversized plates, an Al material is desirable which has a high reversed bending fatigue strength transverse to the rolling direction.

It can be taken from the description that a new requirement profile for the offset printing plates is present on the printing market. The aluminum support used as a substrate should therefore have the following combination of properties:

- a high thermal stability so that the Al substrate will not become soft (not recrystallize) during burning of the photosensitive layer;
- a good roughening behavior in the EC processes based on HCl and $HNO_3$ so that the Al material can be employed universally;
- a high reversed bending fatigue strength, in particular, in the critical transverse direction (relative to the rolling direction) so that the printing plates can be taken from the rolled aluminum coil in any desired orientation.

It is an object of the present invention to develop a litho strip that has a high thermal stability, can be roughened in EC processes based on HCl and $HNO_3$ as efficiently as high-grade aluminium, exhibits after EC roughening a uniform structure-free (streak-free) appearance, and has a high reversed bending fatigue strength perpendicularly to the rolling direction. Moreover, a method is to be provided with which the afore described properties can be produced in the litho strips.

This object is solved according to the invention by the features disclosed in the claims. It was found that technically useful offset printing plates of a width of more than 1,700 mm can be produced with these measures which strips have substantially the same high reversed bending fatigue strength as AA 1050 in the longitudinal direction.

The new litho strip is characterized by a narrowly limited alloy range and by a controlled semi-finished product manufacture with which a fine-grain, recrystallized hot rolled strip can be produced. Also, the further processing must be carried out under controlled conditions so that the microstructure adjusted during the rolling process is maintained.

The development of the new material was carried out in terms of significantly improving the reversed bending fatigue strength of rolled litho strip material in the transverse direction relative to the standard material AA 1050. By means of experiments, it was determined that for this purpose alloy elements are suitable which are in solid solution and/or can be maintained in solid solution in the aluminum mixed crystal: they increase the strength only to a limited extent but have a positive effect on the fatigue behaviour. In this contact, especially the elements Mg, Cu, and Fe are of interest.

Figure 1A:
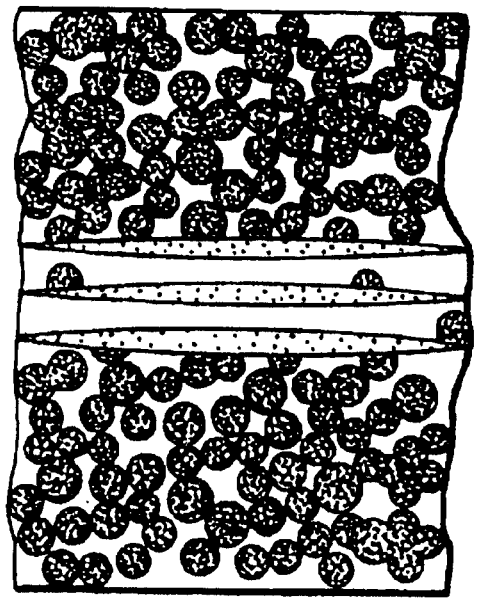
FIG. 1a shows a schematic illustration of the grain structure of the hot rolled strip according to the invention in longitudinal section.

As already mentioned, there is a great difference in the sensitivity with regard to plate cracking or reversed bending fatigue strength depending on the direction in which the printing plate/sample is taken from the rolled Al strip. Coinciding with practical experience, it was determined in laboratory experiments that the measured reversed bending fatigue such for samples taken parallel to the rolling direction ("longitudinal") is higher by a factor of 1.5–4 than for samples taken perpendicularly to the rolling direction ("transverse"). Moreover, it was found that the material analysis and manufacturing-technological measures have a different effect on the properties in the longitudinal and transverse directions of the textured rolled strip. There is no fixed correlation between the reversed bending fatigue strength in the longitudinal direction and the reversed bending fatigue strength in transverse direction.

In the material developments related to this subject that have been published or patterned (U.S. Pat. No. 4,435,230/ furukawa Aluminium Co.; U.S. Pat. No. 3,911,819/ Swiss Aluminium Ltd.), the fatigue behaviour was always considered in the longitudinal direction but not in the critical transverse direction.

Based on high-grade aluminum A199.5 with low contents of silicon, manganese, and copper, it was found that the combined addition of 0.10 to 0.30% magnesium and 0.30 to 0.40% iron increases the reversed bending fatigue strength according to the described testing method to values above 1,250 cycles transverse to the rolling direction. In an especially advantageous further development of the inventive principle, it was found that bending cycles of more than 1,800 could be achieved in the transverse rolling direction, based on the testing method described herein, for a litho strip composed of a rolled aluminum alloy having, in addition to aluminum and any manufacturing impurities, the following limited contents: 0.30–0.40% iron; 0.15–0.30% magnesium; 0.05–0.15% silicon; not more than 0.01% manganese; not more than 0.005% copper; not more than 0.01% chromium; not more than 0.02% zinc; not more than 0.01% titanium; not more than 50 ppm boron; and, if said alloy comprises any impurities resulting from manufacture, said impurities, in sum, amount to less than 0.05% of said alloy.

Moreover, the material according to the invention has a series of further advantages in comparison to lithographic materials known up to now:

The Mg addition enhances the recrystallization in the hot rolled strip. The recrystallized hot rolled strip is required in order to prevent a streaked appearance of the roughened printing plate support. It was found by practical experience that a globulitic grain of a diameter of <50 μm and a continuous, recrystallized layer should be present in order to prevent the streakiness effects on the hot rolled strip surface; in order to safely achieve this in practice, a continuous recrystallization of <75% is to be aimed at, see Table 1.

TABLE 1

| | Characteristic Values of Hot Rolled Strip | | |
|---|---|---|---|
| | Degree of Recrystallization proportion across the layer thickness (%) | Grain Size average grain-Ø measured in a surface layer of 200 μm | Residual Resistance Ratio RR value |
| Standard AA 1050 | 0-50% | >50 μm | 20-30 |
| Material according to the invention | 75-100% | 20-40 μm | 10-20 |

In the Mg-containing material an increase of the roughening speed can be observed, i.e., the required surface-covering roughening process is achieved with reduced load in comparison to high-grade aluminum free of Mg. In order to obtain significant effects, the addition must be at least 0.10%. When the contents surpass 0.3%, the increased etching attack results in an inhomogeneous roughened structure which is unsuitable for printing plates.

The elements Fe—in oversaturated solid solution—has a positive effective on the thermal stability. According to the present experimental results an alloy contents of 0.30–0.40% Fe in combination with a high Fe:Si ratio is optimal. A lower contents has a correspondingly weak effect; a higher contents is detrimental because the Fe will separate only in the form of coarse phase in the cast material which during the subsequently etching attack are attacked with preference, and this results in anon-uniform roughened structure.

For improving the fatigue behaviour, a Cu addition is also possible in principle, as described, for example, in U.S. Pat. No. 3,911,819/Swiss Aluminum Ltd. However, Cu is a problematic alloy additive because additions of <0.04% Cu, which would result in an improvement of the fatigue behaviour, have negative effects on the EC roughness because extremely inhomogeneous structures result.

In order to obtain a streak-free litho strip with high reversed bending fatigue strength transverse to the rolling direction, a controlled semi-finished product manufacture is required in addition to the narrowly limited analysis.

One example of a narrowly limited analysis is as follows: an alloy having, in addition to aluminum and any manufacturing impurities 0.30–0.40% iron; 0.10–0.30% magnesium; 0.05–0.25% silicon; not more than 0.05% magnesium; and not more than 0.04% copper.

A hot-rolled strip according to the invention may be produced from a material such as that having the foregoing narrowly limited analysis as follows:

(a) a rolling ingot of a thickness of <500 millimeters is produced of an alloy having the foregoing narrowly limited analysis by continuous casting and is homogenized at temperatures in the range of 480–620 degrees centigrade for a minimum of 2 hours; and (b) hot rolling is performed with a thickness reduction in the last hot rolling pass in the range of 15 to 75%, a hot rolling end temperature of >250 degrees centigrade, and a hot rolled strip thickness of 2–7 millimeters.

A hot-rolled strip produced using material having the foregoing narrowly limited analysis and corresponding procedure may be cooled to room temperature and may have the following characteristics after cooling (see Table 1).

Figure 1B:
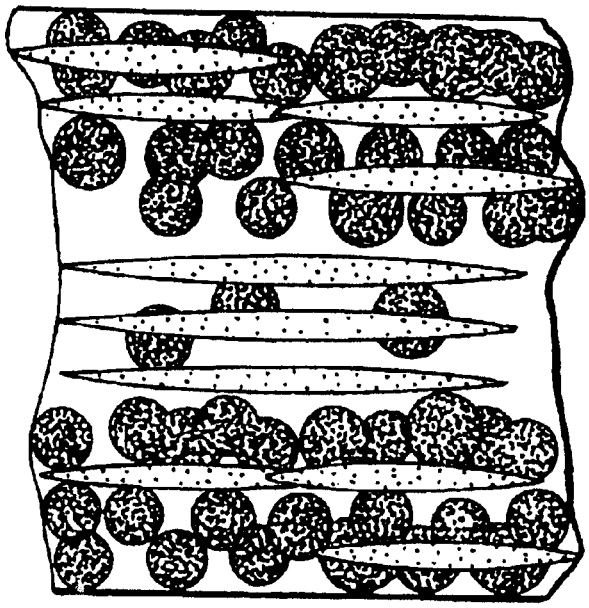
FIG. 1b shows schematically the longitudinal section of a hot rolled strip produced according to standard methods from the alloy AA 1050.

The hot rolled strip is largely continuously recrystallized and has globulitic grains of a diameter of <50 μm at the surface. FIG. 1a shows a schematic illustration of the grain structure of the hot rolled strip according to the invention in longitudinal section. The Figure shows the dark colored globulitic recrystallized grains which extend across more than 75% of the total hot rolled strip thickness. The gray elongate areas represent the grains that are not recrystallized. In comparisons, FIG. 1b shows schematically the longitudinal section of a hot rolled strip produced according to standard methods from the alloy AA 1050; an inhomogeneous mixed crystal structure is present which is in part coarsely recrsytallized, in part not recrystallized.

Upon further rolling the microstructure is maintained in principle; the homogeneous configuration of the hot rolled strip according to the invention prevents streakiness effects on the strip thickness.

The hot rolled strip according to the invention moreover has a residual resistance ratio of RR=10–20 which is characteristic for the material. The measurement of the RR value in the hot rolled strip allows during an early production stage the control of the dissolved elements Fe and Mg which are important for the reversed bending fatigue strength; an RR value in the range of 10–20 ensures the proportion of the elements in solid solution which is required in the finish-rolled strip for a high reversed bending fatigue strength in the transverse direction. (The residual resistance ratio RR is a measure for the alloy proportion which is present in solid solution in the Al mixed crystal; the measuring method for determining the RR value is disclosed in the publication Corrosion Science, Vol. 38, No. 3, pp. 413–429, 1996.).

According to the principles of the invention, the hot rolled strip may, after cooling, be cold rolled with or without intermediate annealing. If intermediate annealing is performed, the degree of rolling reduction is greater than 60%. A final annealing of the cold rolled strip cannot be performed because, even though the reversed bending fatigue strength would be increased in the longitudinal direction by final annealing (compare U.S. Pat. No. 4,435,230/Furukawa Aluminum Co. and U.S. Pat. No. 3,911,819/Swiss Aluminum Ltd.), it would however be reduced in the critical transverse direction.

This means that further processing up to the EC roughening may be carried out with the microstructure that has been adjusted with the rolling process at <100° C. Further processing up to EC roughening may be performed by stretching, degreasing, cutting, and/or pickling while maintaining the microstructure adjusted in the rolling process (at temperatures of <100° C.).

The properties required for the new specification profile of printing plates 1. a thermal stability;
2. a good roughening behaviour in the EC processes based on HCl and $HNO_3$ without producing streakiness effects; and
3. a high reversed bending fatigue strength when taking the printing plates in the transverse direction have been determined according to the following testing criteria.

1. Thermal Stability

The thermal stability is tested by measuring the strength in a tensile test after the litho strip has been annealed for 10 min. at 240° C. This is a standard annealing test which is conventionally performed by printing plate manufacturers and covers the burn-in treatment that is conventional in practice.

Requirement: the material should have a higher thermal strength than AA 1050 after 240° C./10 min., i.e., Rm<145 $N/mm^2$.

2. Roughening Behaviour

Whether a litho strip can be roughened with an electrochemical treatment with good or bad results, depends strongly on the respective process of the printing plate manufacturer. Accordingly, a single testing criterion is not sufficient for the evaluation of the roughening behaviour. Consequently, the three most important properties were tested: the roughening behaviour in an HCl bath, the roughening behaviour in an $HNO_3$ bath, and the tendency to form streaks.

Roughening Test in HCl

Samples of 0.5 $m^2$ were roughened at a constant temperature and constant flow conditions in an electrolyte of 7 g/l hydrochloric acid with alternating current of 50 Hz. The EC roughening is carried out with different roughening loads in the range of 500 to 1,500 $C/cm^2$. Within this range a surface-covering roughening of the sample is usually achieved: the plateau-like mill-finish surface has disappeared and a surface-covering pitted structure results.

Subsequently, a classification of the samples according to the progress of the roughening is performed. For this purpose, a standard sample of the material AA 1050 is always tested simultaneously, and the test material is evaluated in comparison to the standard, respectively.

Classification:

++ surface-covering roughening achieved earlier than with standard;

+ surface-covering roughening achieved as quickly as with standard;

+− surface-covering roughening achieved later than with standard;

− surface-covering roughening achieved considerably later than with standard.

Requirement: the material should be at least as easily roughened as AA 1050, i.e., according to the described test it should have at least a rating of +.

Roughening Test in $HNO_3$

Samples of 0.5 $m^2$ were roughened at a constant temperature and constant flow conditions in an electrolyte of 10 g/l (=1%) nitric acid with alternating current of 50 Hz. The EC roughening is carried out with different roughening loads in the range of 500 to 1,000 C/dm2. In this range a surface-covering roughening of the sample is usually achieved: the smooth rolled surface with mill-finish structure has disappeared and has been replaced by a surface-covering pitted structure.

Subsequently, a classification of the samples according to the progress of the roughening is performed. A standard sample of the material AA 1050 is always tested simultaneously and the test material is evaluated in comparison to the standard, respectively.

Classification:

++ surface-covering roughening achieved earlier than with standard;

+ surface-covering roughening achieved as quickly as with standard;

+− surface-covering roughening achieved later than with standard;

− surface-covering roughening achieved considerably later than with standard.

Requirement: the material should be at least as easily roughened as AA 1050, i.e., according to the described test it should have at least an evaluation of +.

Streakiness Test

Whether a litho strip has the desired structure-free appearance after the EC roughening can be tested by macro-etching. The samples are treated in a freshly prepared macro-etching solution (500 ml $H_2O$, 375 ml HCl, 175 ml $HNO_3$, 50 ml HF, etching for 30 seconds at 25° C.); subsequently, the degree of streakiness is determined by optical testing. The evaluation is carried out in comparison to standard samples which are classified on a scale between 1 (=many streaks) to 10 (=free of streaks, without structure).

Requirement:

Each material must receive a rating of <5 which ensures a streak-free appearance in most EC processes.

3. Reversed Bending Fatigue Strength in the Transverse Direction

There are no standard testing methods in existence for the special load situation of the printing plates on the printing cylinder. The testing is carried out by bending back and forth which, according to practical experience, provides information in regard to the sensitivity relative to plate cracking.

For this purpose, samples of 20 mm width and 100 mm length are taken from the litho strip so that the longitudinal edge of the sample is perpendicular ("transverse") to the rolling direction of the Al strip. The sample is bent back and fourth by a machine about a radius of 30 mm and the bending cycles are counted until cracking occurs; for determining a bending number, 10 samples are tested in this way and the average is calculated based on the 10 values. This bending number provides an indication of the deformation and fatigue behaviour of the material. Upon comparison of the bending numbers of different materials, a statement in regard to the sensitivity relative to plate cracking is possible which correlates with practical experience. Care must be taken that only identical strip thicknesses are compared with one another because the thickness strongly affects the deformation behaviour in the bending test.

Requirement: based on this testing method, the new material should have a substantially higher bending number transverse to the rolling direction than AA 1050 and should have at least the bending number of AA 3103, i.e., a bending number of >1,250 for 0.3 mm strip thickness.

In the following the invention will be explained with the aid of several examples.

EXAMPLES 1, 2, 3 (TABLE 2)

The examples 1, 2 and 3 have the alloy composition according to the invention. The blank material for the strips are rectangular cast ingots of 600 mm thickness produced according to the continuous casting method. After continuous casting and milling off the casting skin, the ingots are annealed at a metal temperature of 580° C./4h and cooled with a cooling rate of >25° C./h to a temperature of 480° C. Subsequently, hot rolling takes place wherein the rolling end temperature is 280–290° C., the thickness reduction in the last pass is approximately 30%, and the hot rolled strip thickness is 4 mm; each hot rolled strip is cooled to room temperature and has the following properties:

a recrystallization of 80 to 85% across the strip thickness;

a fine globulitic grain of a diameter of 20–40 μm measured at the hot rolled strip surface;

upon measuring the electrical resistance, residual resistance ratios RR=13–16 are measured (the RR value is a measure for the alloy proportion present in solid solution in the Al mixed crystal; the measuring process for determining the RR value is disclosed in the publication Corrosion Science, Vol. 38, No. 3, pp. 413–429, 1996).

The properties correspond to the important features listed in Table 1 for hot rolled strips of the alloy according to the invention and the manufacturing process according to the invention; they differ significantly from the typical hot rolled strips of the standard material AA1050. The grain microstructure of the hot rolled strip according to the invention is schematically represented in FIG. 1a. The RR value in the range of 10–20 ensures the required high proportion of alloy elements Mg and Fe present in solid solution which is required for a high reversed bending fatigue strength.

The subsequent cold rolling can be performed in different ways, as explained in an exemplary fashion in the following.

In example 1 the strip manufacture is carried out with intermediate annealing; the heating rate is 35° C./h, the annealing temperature is 400° C. and the annealing period is two hours metal temperature.

In example 2 the strip is manufactured with intermediate annealing wherein the heating rate is 25° C./h, the annealing temperature is 450° C., and the annealing period is 1 min.

In example 3 the strip manufacture is performed without intermediate annealing.

The final thickness is 0.3 mm, respectively. The strip is not subjected to any further annealing but instead is used in the cold-rolled state in the printing plate manufacture.

Table 2 shows that the strips with the alloy composition according to the invention and according to the described manufacturing processes fulfill the requirements with respect to thermal stability (Rm>145 N/mm$^2$) and bending cycles in the transverse direction (>1,250); moreover, they have a very good roughening behaviour in HCl and $HNO_3$ systems which surpasses with respect to the roughening speed the standard material AA 1050. When manufactured with intermediate annealing (examples 1, 2), the strips are completely without structure and obtain highest ratings in the streakiness test. But even when a manufacture without intermediate annealing (example 3), the roughened surface is still sufficiently structure-free and streak-free.

TABLE 2

Materials According to the Invention

Analysis, Manufacture

| Example No. | Printing Plate Support | Analysis wt. % Si | Fe | Mn | Mg | Cu | Manufacture Intermediate Annealing | Final Annealing |
|---|---|---|---|---|---|---|---|---|
| 1 | invention | 0.12 | 0.32 | — | 0.17 | 0.0007 | yes | no |
| 2 | invention | 0.07 | 0.39 | — | 0.24 | 0.001 | yes | no |
| 3 | invention | 0.08 | 0.37 | — | 0.19 | 0.0006 | no | no |

Properties

| Example No. | Printing Plate Support | Strength Rm (N/mm$^2$) after 240° C./10 min. | Bending Test, Number of Cycles Transverse to direction of rolling | Streakiness Test Rating | Roughening Behavior HCl | $HNO_3$ |
|---|---|---|---|---|---|---|
| 1 | invention | 151 | 1,810 | 9 | ++ | ++ |
| 2 | invention | 150 | 2,140 | 10 | ++ | ++ |
| 3 | invention | 155 | 1,960 | 5 | ++ | ++ |
| Requirement | | Rm > 145 N/mm$^2$ | >1,250 | ≧5 | + | + |

TABLE 3

Comparison Standard Material

Analysis, Manufacture

| Example No. | Printing Plate Support | Analysis wt. % Si | Fe | Mn | Mg | Cu | Manufacture Intermediate Annealing | Final Annealing |
|---|---|---|---|---|---|---|---|---|
| 6 | AA 1050 | 0.08 | 0.36 | — | 0.006 | 0.0009 | yes | no |
| 7 | AA 1050 | 0.10 | 0.28 | — | 0.007 | 0.0008 | no | no |
| 8 | AA 3103 | 0.12 | 0.40 | 1.05 | 0.02 | 0.03 | yes | no |

Properties

| Example No. | Printing Plate Support | Strength Rm (N/mm$^2$) after 240° C./10 min. | Bending Test, Number of Cycles Transverse to direction of rolling | Streakiness Test Rating | Roughening Behavior HCl | $HNO_3$ |
|---|---|---|---|---|---|---|
| 6 | AA 1050 | 120 | 580 | 7 | + | + |
| 7 | AA 1050 | 130 | 630 | 2 | + | + |
| 8 | AA 3103 | 160 | 1,240 | 4 | +– * | – |
| Requirement | | Rm > 145 N/mm$^2$ | >1,250 | ≧5 | + | + |

* cannot be used universally

COMPARATIVE EXAMPLES 6, 7, 8 (TABLE 3)

In table 3 the properties of the standard materials AA1050 and AA3103 that have been used up to now for offset printing plates are listed. They differ from the strips according to the invention essentially by their analysis; the semifinished product manufacture is carried out in the same manner as in the examples 1, 2, 3.

Examples 6+7: The standard material AA1050 (high-grade aluminium) does not fulfill—produced with or without intermediate annealing—the requirements with respect to thermal stability and reversed bending fatigue strength in the transverse direction. In the manufacture of AA 1050 with intermediate annealing (example 6), the strip has good ratings in the streakiness test; in the manufacture without intermediate annealing (example 7), the roughened surface has a streaked appearance. In the EC roughening by the HCl and $HNO_3$ processes, for AA 1050 higher loads as for the examples according to the invention are required for a surface-covering roughening .

Example 8: The material AA 1030 used for offset printing plates is an alloy which fulfills the requirements with regard to strength and reversed bending fatigue strength because of its Mn contents of approximately 1%. A disadvantage of the material is that it cannot be universally used in EC roughening: a roughening by the $HNO_3$ process is not possible and thus not conventional; in the EC roughening by the HCl process, a very high load is required for obtaining a homogeneous surface-covering—etched pitted structure. The requirements of the streakiness test are not fulfilled.

A common feature of examples 4, 5, 9 is that they fulfill the requirements with regard to the streakiness test. This is so because the strips, as in the examples 1, 2, 3 according to the invention, have been produced from a substantially recrystallized hot rolled strip. Otherwise, the following differences can be observed.

Example 4 was produced with material according to the analysis and manufacture according to the invention but with a final annealing at 200° C./h. The thermal stability is similar and the roughening behaviour in both acid systems is as good as with the example 3 according to the invention. The reversed bending fatigue strength in the transverse direction, however, does not corresponds to the required level.

Example 9 differs from the analysis according to the invention by a lower Fe contents of <0.3%; the manufacture is identical to that of example 3. It is to be noted that the requirements—with the exception of thermal stability—are fulfilled. From this it can be deduced that a higher Fe contents is required for obtaining a sufficiently high thermal stability.

Example 5 differs from the example 3 according to the invention by a lower Fe contents of <0.3% as well as by the manufacture which is performed without intermediate annealing and with a final annealing to the cold rolled strip at 200° C./h. This variant corresponds to a material which is disclosed in U.S. Pat. No. 4,435,230 (Furukawa Aluminium Co.). According to the letters patent, it is characterized by a very good fatigue behaviour (in the longitudinal direction) and a good roughening behaviour in the HCl process. It is to be noted that the requirements with regard to the reversed bending fatigue strength in the critical transverse direction is not fulfilled and also that the desired thermal stability cannot be achieved. The roughening behaviour, as described in the patent, is good.

The material of the example 10 is one that is described in the U.S. Pat. No. 3,911,819 (Swiss Aluminium Ltd.). The

TABLE 4

Mg-Containing Materials Not in Accordance with the Invention

| | | Analysis, Manufacture | | | | | | |
|---|---|---|---|---|---|---|---|---|
| | | | | | | | Manufacture | |
| | Printing | Analysis wt. % | | | | | Intermediate | Final |
| Example No. | Plate Support | Si | Fe | Mn | Mg | Cu | Annealing | Annealing |
| 4 | comparison | 0.09 | 0.34 | — | 0.20 | 0.0005 | no | yes |
| 9 | comparison | 0.12 | 0.26 | — | 0.25 | 0.0009 | no | no |
| 5 | comparison | 0.10 | 0.24 | — | 0.22 | 0.0010 | no | yes |
| 10 | comparison | 0.20 | 0.50 | — | 0.20 | 0.55 | yes | yes |

| | | Properties | | | | |
|---|---|---|---|---|---|---|
| | Printing Plate | Strength Rm ($N/mm^2$) | Bending Test, Number of Cycles | Streakiness Test | Roughening Behavior | |
| Example No. | Support | after 240° C./10 min. | Transverse HR | Rating | HCl | $HNO_3$ |
| 4 | comparison | 147 | 1,180 | 5 | ++ | ++ |
| 9 | comparison | 130 | 1,545 | 5 | ++ | ++ |
| 5 | comparison | 129 | 1,220 | 5 | ++ | ++ |
| 10 | comparison | not determined | not determined | not determined | – | – |
| Requirement | | Rm > 145 $N/mm^2$ | >1,250 | ≧5 | + | + |

COMPARATIVE EXAMPLES 4, 5, 9, 10 (TABLE 4)

In Table 4 the properties of litho strips for offset printing plates are compiled which are produced of Mg-containing materials which, however, differ otherwise with regard to analysis and/or strip manufacture from the examples according to the invention.

alloy is characterized primarily by a Cu addition. A good fatigue behaviour is attested for the material which is understandable in view of the analysis. A statement in regard to the roughening behaviour is missing in the patent.—It was determined that the Cu additions of >0.04% in AA 1050 as well as in AA 3103 alloys have negative effects in the electrochemical roughening. The Cu-containing material in the example 10 can be used only in purely mechanical roughening and is unsuitable for electrochemical roughening by the HCl and $HNO_3$ processes because the required litho strip qualities cannot be achieved.

From the description of the comparative examples it can be taken that only the examples according to the invention provide the desired combination of all properties a high thermal stability;

a good roughening behaviour in EC processes based on HCl and $HNO_3$, a macroscopic streak-free appearance, and a high reversed bending fatigue strength when taking the printing plate in the critical transverse direction, and thus have the required qualities for an offset printing plate.

What is claimed is:

[1. A litho strip for electrochemical roughening comprising a rolled aluminum alloy, said aluminum alloy comprising in addition to impurities resulting from manufacture:

aluminium;

0.30–0.40% iron;

0.10–0.30% magnesium;

0.05–0.25% silicon;

not more than 0.05% manganese; and not more than 0.04% copper; wherein:

said litho strip has a rolling direction;

said litho strip has a reversed bending fatigue strength perpendicular to said rolling direction, said reversed bending fatigue strength having a value greater than 1,250 cycles in a reversed bending test; and said litho strip has a surface, globulitic recrystallized grains, and a residual resistance ratio RR, said grains being disposed in said surface and having an average diameter of less than 50 microns, and said residual resistance ratio having a value in the range 10–20; and said litho strip, after test annealing at 240° C. for 10 minutes, has a tensile strength, Rm, greater than 145 $N/mm^2$.]

[2. The litho strip according to claim 1, wherein:

if said alloy comprises any impurities, said any impurities individually amount to less than 0.03% of said alloy; and all of said impurities, in sum, amount to less than 0.10% of said alloy.]

[3. The litho strip of claim 2 wherein:

said litho strip is produced from a hot rolled strip that is continuously recrystallized to more than 75%.]

[4. The litho strip of claim 1 wherein:

said litho strip is produced from a hot rolled strip that is continuously recrystallized to more than 75%.]

5. A method for manufacturing a printing plate support from a litho strip [defined by claim 1] comprising:

electrochemically roughening said litho strip by placing said litho strip in an acid bath, said acid selected from the group consisting of HCl and $HNO_3$;

providing an alternating current in said acid bath; and subsequently anodizing said litho strip;

*the litho strip comprising a rolled aluminum alloy, said aluminum alloy comprising in addition to impurities resulting from manufacture;*

*aluminum;*

*0.30–0.40% iron;*

*0.10–0.30% magnesium;*

*0.05–0.25% silicon;*

*not more than 0.05% manganese; and*

*not more than 0.04% copper; wherein:*

*said litho strip has a rolling direction;*

*said litho strip has a reversed bending fatigue strength perpendicular to said rolling direction, said reversed bending fatigue strength having a value greater than 1,250 cycles in a reversed bending test; and*

*said litho strip is produced from a hot rolled strip, the hot rolled strip having a surface, globulitic recrystallized grains, and a residual resistance ratio RR, said grains being disposed in said surface and having an average diameter of less than 50 microns, and said residual resistance ratio having a value in the range 10–20; and*

*said litho strip, after test annealing at 240° C. for 10 minutes, has a tensile strength, Rm, greater than 145 $N/mm^2$.*

6. A method for manufacturing a printing plate for rotary offset printing from a printing plate support comprising:

manufacturing said printing plate support according to the method of claim 5; and providing said printing plate with a photo-sensitive hydrophobic layer.

7. A litho strip for electrochemical roughening comprising a rolled aluminum alloy, said aluminum alloy comprising, in addition to any impurities from manufacture:

aluminum;

0.30–0.40% iron;

0.15–0.30% magnesium;

0.05–0.15% silicon;

not more than 0.01% manganese;

not more than 0.005% copper;

not more than 0.01% chromium;

not more than 0.02% zinc;

not more than 0.01% titanium;

not more than 50 ppm boron; and, if said alloy comprises any impurities resulting from manufacture, said impurities, in sum, amount to less than 0.05% of said alloy, wherein:

said litho strip has a rolling direction;

said litho strip has a reversed bending fatigue strength perpendicular to said rolling direction, said reversed bending fatigue strength having a value greater than 1,250 cycles in a reversed bending test; and said litho strip, after test annealing at 240° C. for 10 minutes, has a tensile strength, Rm, greater than 145 $N/mm^2$.

8. The litho strip of claim 7 wherein:

said litho strip is produced from a hot rolled strip [that is], *the hot rolled strip being* continuously recrystallized to more than 75%; and

[said litho strip has] *having* a surface layer comprising globulitic grains, said globulitic grains having an average grain diameter of less than 50 microns.

9. A method for producing a litho strip comprising:

producing a rolling ingot of a thickness greater than 500 millimeters from an aluminum alloy, said aluminum alloy comprising in addition to impurities resulting from manufacture:

aluminum;

0.30–0.40% iron;

0.10–0.30% magnesium;

0.05–0.25% silicon;

not more than 0.05% manganese; and not more than 0.04% copper, wherein:

said producing comprises:

continuous casting; and homogenizing at a temperature in the range 480–620 degrees centigrade for no less than two hours;

hot rolling said rolling ingot into a hot rolled strip wherein:

said hot rolling comprises a last hot rolling pass, said last hot rolling pass reducing the thickness of said hot rolled strip by 15 to 75%;

said hot rolling has a hot rolling end temperature of greater than 250 degrees centigrade; and said hot rolling causes said hot rolled strip to have a thickness of 2–7 millimeters;

cooling said hot rolled strip to room temperature to produce a cooled hot rolled strip, said cooled hot rolled strip having a surface, globulitic recrystallized grains, and a residual resistance ratio RR, said grains being disposed in said surface and having an average diameter of less than 50 microns, and said residual resistance ratio having a value in the range 10–20;

cold rolling said cooled hot rolled strip to form a cold rolled strip; and further processing said cold rolled strip prior to electrochemical roughening, said cold rolled strip having a microstructure formed during said hot and cold rolling and a temperature less than 100 degrees centigrade, while maintaining said microstructure and said temperature, wherein said further processing is selected from the group consisting of:

a. stretching;

b. degreasing;

c. cutting;

d. pickling; and a combination of any of (a)–(d).

10. The method of claim 9 further comprising allowing intermediate annealing, wherein, after intermediate annealing, said cold rolling comprises achieving a rolling reduction of greater than 60%.

11. The method according to claim 10, wherein said hot rolled strip has a metal temperature and said intermediate annealing comprises:

annealing at a slow heating rate, said slow heating rate in the range 10 to 75 centigrade degrees per hour;

maintaining said metal temperature in the range 300 to 500 degrees centigrade; and allowing said intermediate annealing to occur for an annealing time, said annealing time greater than 1 hour.

12. The method according to claim 10, wherein said hot rolled strip has a metal temperature and said intermediate annealing comprises:

annealing at a fast heating rate, said fast heating rate in the range 5 to 40 centigrade degrees per second;

maintaining said metal temperature in the range 400 to 500 degrees centigrade; and allowing said intermediate annealing to occur for an annealing time, said annealing time in the range 2 seconds to 2 minutes.

* * * * *

UNITED STATES PATENT AND TRADEMARK OFFICE

CERTIFICATE OF CORRECTION

PATENT NO. : RE 40,788 E
APPLICATION NO. : 10/938496
DATED : June 23, 2009
INVENTOR(S) : Von Asten et al.

It is certified that error appears in the above-identified patent and that said Letters Patent is hereby corrected as shown below:

On the Title Page Item (73), under Assignee, delete "Cologne" and replace it with --Bonn--.

Signed and Sealed this

First Day of September, 2009

David J. Kappos

David J. Kappos
*Director of the United States Patent and Trademark Office*